US 6,673,323 B1

(12) United States Patent
Bhatnagar et al.

(10) Patent No.: US 6,673,323 B1
(45) Date of Patent: Jan. 6, 2004

(54) TREATMENT OF HAZARDOUS GASES IN EFFLUENT

(75) Inventors: Ashish Bhatnagar, San Jose, CA (US); Tony S. Kaushal, Cupertino, CA (US); Kwok Manus Wong, San Jose, CA (US); Shamouil Shamouilian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/535,461

(22) Filed: Mar. 24, 2000

(51) Int. Cl.⁷ .............................................. B01D 47/00
(52) U.S. Cl. .................... 423/210; 423/240 R; 588/212
(58) Field of Search ........................... 423/240 R, 210; 204/169, 170; 588/212

(56) References Cited

U.S. PATENT DOCUMENTS

| | | |
|---|---|---|
| 3,983,021 A | 9/1976 | Henis ........................ 204/164 |
| 4,479,443 A | 10/1984 | Faldt et al. ................. 110/346 |
| 4,735,633 A | 4/1988 | Chiu ............................... 55/2 |
| 4,753,915 A | 6/1988 | Vogt et al. .................. 502/304 |
| 4,788,036 A | 11/1988 | Eiselstein et al. ........... 420/448 |
| 4,954,320 A | 9/1990 | Birmingham et al. .. 422/186.04 |
| 4,966,611 A | 10/1990 | Schumacher et al. .......... 55/20 |
| 5,137,701 A | 8/1992 | Mundt ........................ 423/210 |
| 5,149,378 A | 9/1992 | Ohmi et al. |
| 5,151,116 A | 9/1992 | Scholz et al. ................. 55/387 |
| 5,176,897 A | 1/1993 | Lester ........................ 423/659 |
| 5,187,344 A | 2/1993 | Mizuno et al. .......... 219/121.5 |
| 5,191,184 A | 3/1993 | Shin .................... 219/10.55 R |
| 5,280,012 A | 1/1994 | Kirlin et al. |
| 5,417,934 A | 5/1995 | Smith et al. ................. 422/177 |
| 5,439,568 A | 8/1995 | Uchiyama ................... 204/164 |
| 5,453,125 A | 9/1995 | Krogh ................. 118/723 MR |
| 5,510,066 A | 4/1996 | Fink et al. ................. 264/40.1 |
| 5,584,959 A | 12/1996 | Kimura et al. .............. 156/345 |
| 5,589,148 A | 12/1996 | Otsuka et al. |
| 5,597,495 A | 1/1997 | Keil et al. |
| 5,597,540 A | 1/1997 | Akita et al. |
| 5,609,736 A * | 3/1997 | Yamamoto .................. 204/164 |
| 5,643,545 A | 7/1997 | Chen et al. |
| 5,663,476 A | 9/1997 | Cripe et al. |
| 5,720,444 A | 2/1998 | Wheeler et al. ......... 242/364.1 |
| 5,720,931 A | 2/1998 | Rossin et al. ............... 423/236 |
| 5,750,823 A * | 5/1998 | Wofford et al. ............. 588/210 |
| 5,762,893 A | 6/1998 | Scholz et al. ............. 423/240 S |
| 5,779,863 A | 7/1998 | Ha et al. ...................... 203/74 |
| 5,779,998 A * | 7/1998 | Tom ........................... 423/210 |
| 5,817,284 A | 10/1998 | Nakano et al. |
| 5,843,288 A * | 12/1998 | Yamamoto .................. 204/164 |
| 5,858,065 A | 1/1999 | Li et al. ......................... 95/45 |
| 5,865,879 A | 2/1999 | Lee ............................. 95/273 |
| 5,914,091 A | 6/1999 | Holst et al. ................. 422/173 |
| 5,955,037 A | 9/1999 | Holst et al. |
| 5,965,786 A | 10/1999 | Rostaing et al. |
| 6,187,072 B1 | 2/2001 | Cheung et al. |

FOREIGN PATENT DOCUMENTS

| | | |
|---|---|---|
| DE | 215706 | 11/1984 |
| DE | 4319118 | 12/1994 |
| JP | 51129868 | 11/1976 |
| JP | 5845718 | 3/1983 |
| JP | 39768 | 2/1991 |
| JP | 10192653 | 7/1998 |
| WO | 9926726 | 6/1999 |

OTHER PUBLICATIONS

PCT Search Report dated Oct. 24, 2001, European Patent Office, P.B. 5818 Patentlaan 2, NL–2280 HV Risiswijk.
Complete copy of the "ASTRON™ Atomic Fluorine Generator Model AX7650 Installation and Operations Manual," dated Dec. 24, 1998.
"ASTRON™—Atomic Fluorine Generator" web site page (1 sheet) located at www.astex.com Sep. 30, 1999.
Two vugraphs which were used in a presentation at Applied Materials on Mar. 10, 1999.

* cited by examiner

Primary Examiner—Stanley S. Silverman
Assistant Examiner—Edward M. Johnson
(74) Attorney, Agent, or Firm—Janah & Associates

(57) ABSTRACT

A method for reducing hazardous gases exhausted from a process chamber includes an effluent gas treatment system with a gas energizing reactor and an additive gas source. Additive gas comprising reactive gas is introduced into the effluent from the process chamber in a volumetric flow rate in relation to the hazardous gas content in the effluent.

26 Claims, 7 Drawing Sheets

TREATMENT OF HAZARDOUS GASES IN EFFLUENT

BACKGROUND

The present invention is related to an apparatus and method for reducing a hazardous gas content of an effluent from a process chamber.

Fluorocarbon, chlorofluorocarbons, hydrocarbon, and other fluorine containing gases are used in, or formed as a byproduct during, the manufacture of active and passive electronic circuitry in process chambers. These gases are toxic to humans and hazardous to the environment. In addition, they may also strongly absorb infrared radiation and have high global warming potentials. Especially notorious are persistent fluorinated compounds or perfluorocompounds (PFCs) which are long-lived, chemically stable compounds that have lifetimes often exceeding thousands of years. Some examples of PFCs are carbon tetrafluoride ($CF_4$), hexafluoroethane ($C_2F_6$), octafluorocyclopropane or perfluorocyclobutane ($C_4F_8$), difluoromethane ($CH_2F_2$), hexafluorobutadiene or perfluorocyclobutene ($C_4F_6$), perafluoropropane ($C_3F_8$), trifluoromethane ($CHF_3$), sulfur hexafluoride ($SF_6$), nitrogen trifluoride ($NF_3$), and the like. For example, $CF_4$ has a lifetime in the environment of about 50,000 years and can contribute to global warming for up to 6.5 million years. Thus it is desirable to have an apparatus or method that can reduce the hazardous gas content of effluents, and especially PFCs, that may be released from the process chambers.

Perfluorocompounds are utilized in numerous semiconductor fabrication processes. For example, perfluorocompounds are used in the etching of layers on substrates, such as oxide, metal and dielectric layers. Perfluorocompounds can also be used during chemical vapor deposition processes. Additionally, process chambers can be cleaned of etch or deposition residue using perfluorocompounds. These hazardous compounds are either introduced into a process chamber or are formed as byproducts within the process chamber and may be exhausted from the chamber in an effluent gas stream.

Plasma devices have been used to reduce the PFC content of effluents with limited success. Conventional attempts have not proven to adequately remove a significantly high percentage of the PFC gases from the effluent. For example, in one typical process, Ar, $O_2$, and PFC-containing gas are simultaneously added in a plasma chamber at a fixed volumetric flow ratio of Ar to $O_2$ equal to or greater than 3. The high Ar to $O_2$ volumetric flow ratio in the conventional process is necessary to ignite and to adequately sustain the plasma. However, this process has a reduction efficiency of below 95% for many PFC gases and significantly below 95% for many complex mixtures of PFC gases. As a result, the conventional process may have to exhaust a higher than desired level of PFCs into the environment.

Thus, it is desirable to minimize the introduction of such harmful gases and byproducts into the environment. There is also a need to minimize the harmful content of the effluent gas released into the atmosphere in an efficient and inexpensive manner. There is a further need to reduce PFC and other harmful gases to the lowest possible levels, preferably by at least about 95%, especially for industries which widely use PFCs, even though such use is a relatively small component of the overall consumption or release of PFCs in the world.

SUMMARY

The present invention is useful for reducing a content of hazardous gases, such as PFCs, in an effluent gas, such as an effluent that results from processing of substrates, for example semiconductor wafers and other electronic devices. By hazardous gas it is meant any toxic, harmful or undesirable gas, including but not limited to PFCs, chlorofluorocarbons (CFCs), hydrocarbons, other fluorine containing gases, and other undesirable gases.

In one aspect of the invention, a method of treating a chamber effluent gas comprising a hazardous gas comprises introducing the effluent gas into a reactor, introducing an additive gas comprising at least one oxygen containing gas into the reactor, the volumetric flow rate of oxygen containing gas being selected so that the ratio of oxygen atoms in the additive gas to carbon atoms in the hazardous gas is at least about 2.4:1, and energizing the effluent and additive gas in the reactor.

In another aspect of the invention, a method of treating a chamber effluent gas comprises introducing the effluent gas into a reactor, introducing an additive gas comprising a reactive gas and an inert or non-reactive gas into the reactor at a volumetric flow ratio of inert or non-reactive gas to reactive gas of less than 3:1, and energizing the effluent and additive gas in the reactor.

In another aspect of the invention, a method of energizing an effluent gas from a chamber comprises introducing an additive gas into a reactor, the additive gas comprising an inert or non-reactive gas at a first volumetric flow rate, changing the volumetric flow rate of the inert or non-reactive gas to a second volumetric flow rate, introducing the effluent gas into the reactor, and energizing the gases in the reactor.

In another aspect of the invention, a method of treating a chamber effluent gas comprises introducing an additive gas into a reactor, the additive gas comprising a reactive gas at a first volumetric flow rate, changing the volumetric flow rate of the reactive gas to a second volumetric flow rate, introducing the effluent gas into the reactor, and energizing the gases in the reactor.

In another aspect of the invention, a method of treating a chamber effluent gas comprises detecting a condition of the effluent, introducing the effluent gas into a reactor, introducing an additive gas into the reactor at a volumetric flow rate in relation to the detected condition, and energizing the effluent and additive gas in the reactor.

In another aspect of the invention, a method of treating a chamber effluent comprising a hazardous gas comprises introducing the effluent gas into a reactor, introducing an additive gas comprising at least one oxygen containing gas into the reactor, the volumetric flow rate of oxygen containing gas being selected so that the ratio of oxygen atoms in the additive gas to sulfur atoms in the hazardous gas is at least about 2.4:1, and energizing the effluent and additive gas in the reactor.

In another aspect of the invention, a method of treating a chamber effluent gas comprising a hazardous gas comprises introducing the effluent gas into a reactor, introducing an additive gas comprising at least one oxygen containing gas into the reactor, the volumetric flow rate of oxygen containing gas being selected so that the ratio of oxygen atoms in the additive gas to nitrogen atoms in the hazardous gas is at least about 2.4:1, and energizing the effluent and additive gas in the reactor.

In another aspect of the invention, a gas treatment apparatus capable of treating a chamber effluent gas comprising a hazardous gas comprises a source of additive gas comprising an oxygen containing gas, a reactor adapted to receive the effluent gas and the additive gas, a controller adapted to control the introduction of additive gas into the reactor so that the ratio of oxygen atoms in the additive gas to carbon atoms in the hazardous gas is at least about 2.4:1, and a gas energizer adapted to energize the gases in the reactor.

In another aspect of the invention, a gas treatment apparatus capable of treating a chamber effluent gas comprises a source of additive gas comprising a reactive gas and an inert or non-reactive gas, a reactor adapted to receive the effluent gas and the additive gas, a controller adapted to control the introduction of additive gas into the reactor so that the volumetric flow ratio of inert or non-reactive gas to reactive gas is less than 3:1, and a gas energizer adapted to energize the gases in the reactor.

In another aspect of the invention, an apparatus capable of energizing an effluent gas from a chamber comprises a source of additive gas comprising an inert or non-reactive gas, a reactor adapted to receive the effluent gas and the additive gas, a controller adapted to control the introduction of additive gas into the reactor so that the inert or non-reactive gas is introduced at a first and second volumetric flow rate, and a gas energizer adapted to energize the gases in the reactor.

In another aspect of the invention, a gas treatment apparatus capable of treating a chamber effluent gas comprises a source of additive gas comprising a reactive gas, a reactor adapted to receive the effluent gas and the additive gas, a controller adapted to control the introduction of additive gas into the reactor so that the reactive gas is introduced at a first and second volumetric flow rate, and a gas energizer adapted to energize the gases in the reactor.

In another aspect of the invention, a gas treatment apparatus capable of treating a chamber effluent gas comprises a source of additive gas comprising a reactive gas, a reactor adapted to receive the effluent gas and the additive gas, a detector capable of detecting a condition in the effluent and generating a signal in relation to the detected condition, a controller adapted to control the introduction of additive gas into the reactor, and a gas energizer adapted to energize the gases in the reactor.

In another aspect of the invention, a gas treatment apparatus capable of treating a chamber effluent gas comprising a hazardous gas comprises a source of additive gas comprising an oxygen containing gas, a reactor adapted to receive the effluent gas and the additive gas, a controller adapted to control the introduction of additive gas into the reactor so that the ratio of oxygen atoms in the additive gas to sulfur atoms in the hazardous gas is at least about 2.4:1, and a gas energizer adapted to energize the gases in the reactor.

In another aspect of the invention, a gas treatment apparatus capable of treating a chamber effluent gas comprising a hazardous gas comprises a source of additive gas comprising an oxygen containing gas, a reactor adapted to receive the effluent gas and the additive gas, a controller adapted to control the introduction of additive gas into the reactor so that the ratio of oxygen atoms in the additive gas to nitrogen atoms in the hazardous gas is at least about 2.4:1, and a gas energizer adapted to energize the gases in the reactor.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

The present invention relates to a gas treatment apparatus for use with a process chamber and a method of abating a hazardous gas content of effluent from the process chamber. The description and accompanying drawings represent illustrative embodiments of the invention and are not intended to limit the invention.

Figure 1:
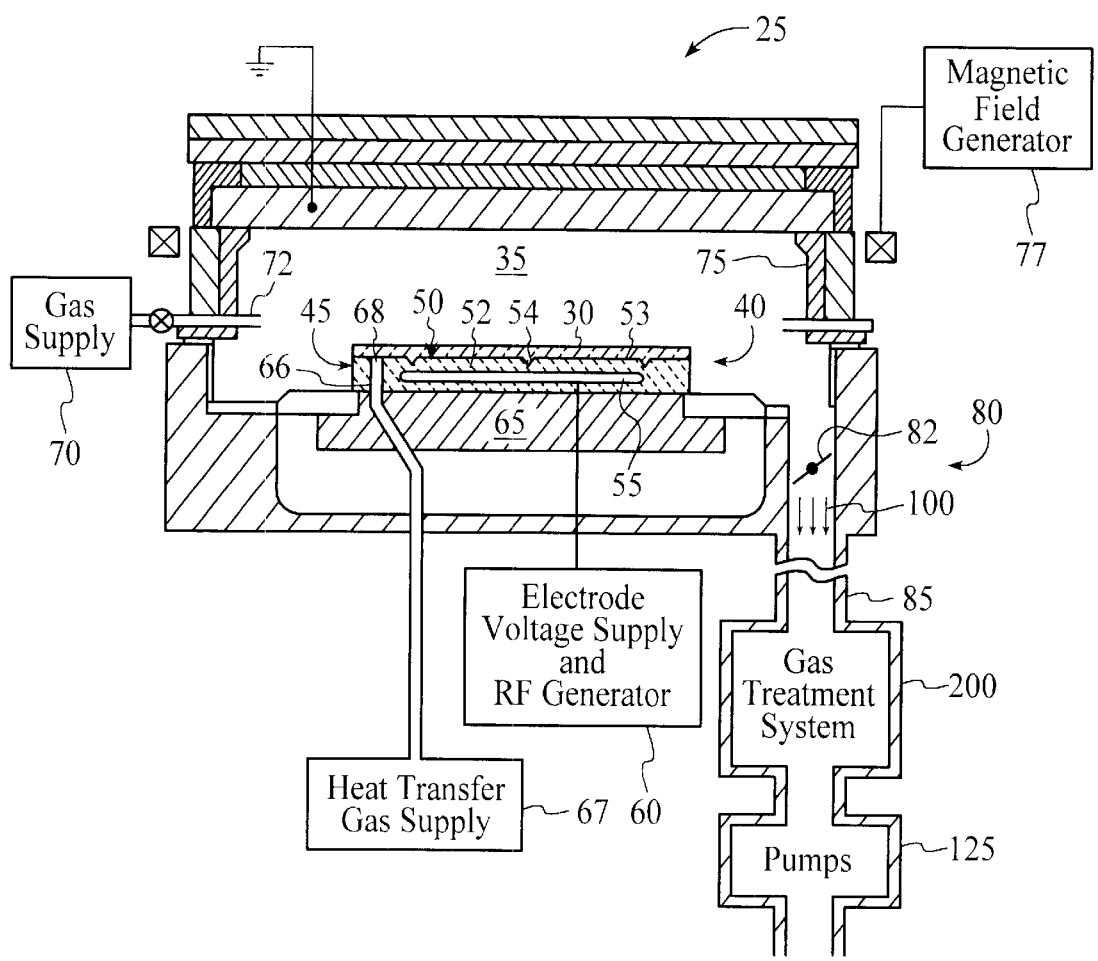
FIG. 1 is a schematic sectional side view of an exemplary substrate processing apparatus for processing a substrate and producing effluent containing hazardous gases showing a gas treatment system in the exhaust.

An exemplary substrate processing apparatus 20, as illustrated in FIG. 1, comprises a chamber 25 such as for example, an MxP, an MxP+, or an MxP Super e_chamber, commercially available from Applied Materials Inc., Santa Clara, Calif., and generally described in commonly assigned U.S. Pat. Nos. 4,842,683 and 5,215,619 to Cheng, et al; and U.S. Pat. No. 4,668,338 to Maydan, et al., all of which are incorporated herein by reference in their entireties. Such chambers can be used in a multi-chamber integrated process system as for example, described in U.S. Pat. No. 4,951,601 to Maydan, et al., which is also incorporated herein by reference. The particular embodiment of the chamber 25 shown herein, is suitable for processing of substrates 30, such as semiconductor wafers. The exemplary embodiment is provided only to illustrate the invention, and should not be used to limit the scope of the invention.

During processing, the chamber 25 is evacuated to a low pressure of less than about 500 mTorr, and a substrate 30 is transferred to a plasma zone 35 of the chamber 25 from a load lock transfer chamber (not shown) maintained at vacuum. The substrate 30 is held on a support 40, which optionally comprises a mechanical or electrostatic chuck 45. A typical electrostatic chuck 45 comprises an electrostatic member 50 comprising a dielectric layer 52 having a surface 53 adapted to receive the substrate 30. The dielectric layer 52 covers an electrode 55—which may be a single conductor or a plurality of conductors—which is chargeable to electrostatically hold the substrate 30. After the substrate 30 is placed on the chuck 45, the electrode 55 is electrically biased with respect to the substrate 30 by an electrode voltage supply 60 to electrostatically hold the substrate 30. A base 65 below the electrostatic chuck 45 supports the chuck, and optionally, is also electrically biased with an RF bias voltage. The surface 53 may have grooves 54 in which a heat transfer gas, such as helium, is held to control the temperature of the substrate 30. The heat transfer gas is provided via gas conduits 66 having one or more outlets 68 that deliver the gas to the surface 53 of the chuck 45 and that extend through one or more of the electrodes 55 and dielectric layer 52. A heat transfer gas supply 67 supplies heat transfer gas to the conduits 66 via a gas supply channel.

Process gas is introduced into the chamber 25 through a gas supply 69 that includes a first gas supply 70 and one or more gas nozzles 72 terminating in the chamber 25. The gas in the chamber 25 is typically maintained at a low pressure. A plasma is formed in the plasma zone 35 from the gas by coupling electromagnetic energy to the process gas. In the chamber 25, the plasma is capacitively generated by applying an RF voltage to the electrode 55 (which serves as the cathode electrode) and by electrically grounding the sidewalls 75 of the chamber 25 to form the other (anode) electrode 55. In an alternative chamber embodiment (not shown), the process gas may be energized by applying an RF current to an inductor coil (not shown) adjacent the chamber 25 to inductively couple energy into the chamber 25 and generate the plasma in the plasma zone 35. The frequency of the RF current applied to the electrode 55 or to the inductor coil (not shown) is typically from about 50 KHz to about 60 MHz. The capacitively generated plasma can also be enhanced by electron cyclotron resonance in a magnetically enhanced reactor in which a magnetic field generator 77, such as a permanent magnet or electromagnetic coils, provides a magnetic field that may increase the density and uniformity of the plasma in the plasma zone 35. Preferably, the magnetic field comprises a rotating magnetic field with the axis of the field rotating parallel to the plane of the substrate 30, as described in U.S. Pat. No. 4,842,683.

Effluent 100 comprising process gas and process byproducts is exhausted from the chamber 25 through an exhaust system 80 capable of achieving a low pressure in the chamber 25. The exhaust system 80 comprises an exhaust tube 85 that leads to one or a plurality of pumps 125, such as roughing and high vacuum pumps, that evacuate the gas in the chamber 25. A throttle valve 82 is provided in the exhaust tube 85 for controlling the pressure of the gas in the chamber 25. Also, an optical endpoint measurement technique may be used to determine completion of the etching process by measuring a change in radiation emission intensity of a gas species in the chamber 25 or measuring the intensity of radiation reflected from a layer being processed on the substrate 30.

During operation of the chamber 25 in a typical process, a substrate 30 is placed on the support 40 in the process chamber 25, and a process gas comprising, for example, halogen-containing gas, such as fluorine-containing gas, for example $CF_4$, $C_2F_6$, $C_3F_8$, $CHF_3$, $SF_6$, $NF_3$, $CH_3F$, $C_4F_8$, $CH_2F_2$, $C_4F_6$ and equivalents thereof, is introduced into the process zone 35 through the gas supply 69. The process gas is energized by the gas energizer 60 in the chamber 25 to, for example, process the substrate 30 in an electromagnetically energized plasma gas or a microwave energized gas. Alternatively, the gas may be energized in a remote chamber (not shown) and then introduced into the chamber 25. During and after processing, an effluent gas stream 100 of spent process gas and gaseous byproducts is exhausted from the process chamber 25 and into the exhaust tube 85. The fluorine-containing gas can also be used in a process chamber cleaning process.

To treat the effluent 100, for example abating hazardous and undesirable gases, such as PFC gases, from the effluent 100, the effluent 100 may be passed through a gas treatment system 200 comprising a gas energizing reactor 210. The effluent gas 100 may be delivered through exhaust tube 85 to the gas energizing reactor 210, such as a plasma reactor as shown for example in FIG. 2. The gas energizing reactor 210 is a reactor for energizing a gas, including for example microwave activation reactors and is not limited to reactors for generating a plasma. In flowing from a reactor inlet 211 to a reactor outlet 212, energy is coupled to the effluent 100 in a reactor chamber 215 by applying energy from a gas energizing system 220 to the chamber 215. The energized gas forms a plasma in the reactor chamber 215 generating free radicals from the components in the effluent 100. In the gas energizing reactor 210, the free radicals combine to produce an abated effluent 101 that has a reduced hazardous gas content.

Figure 2:
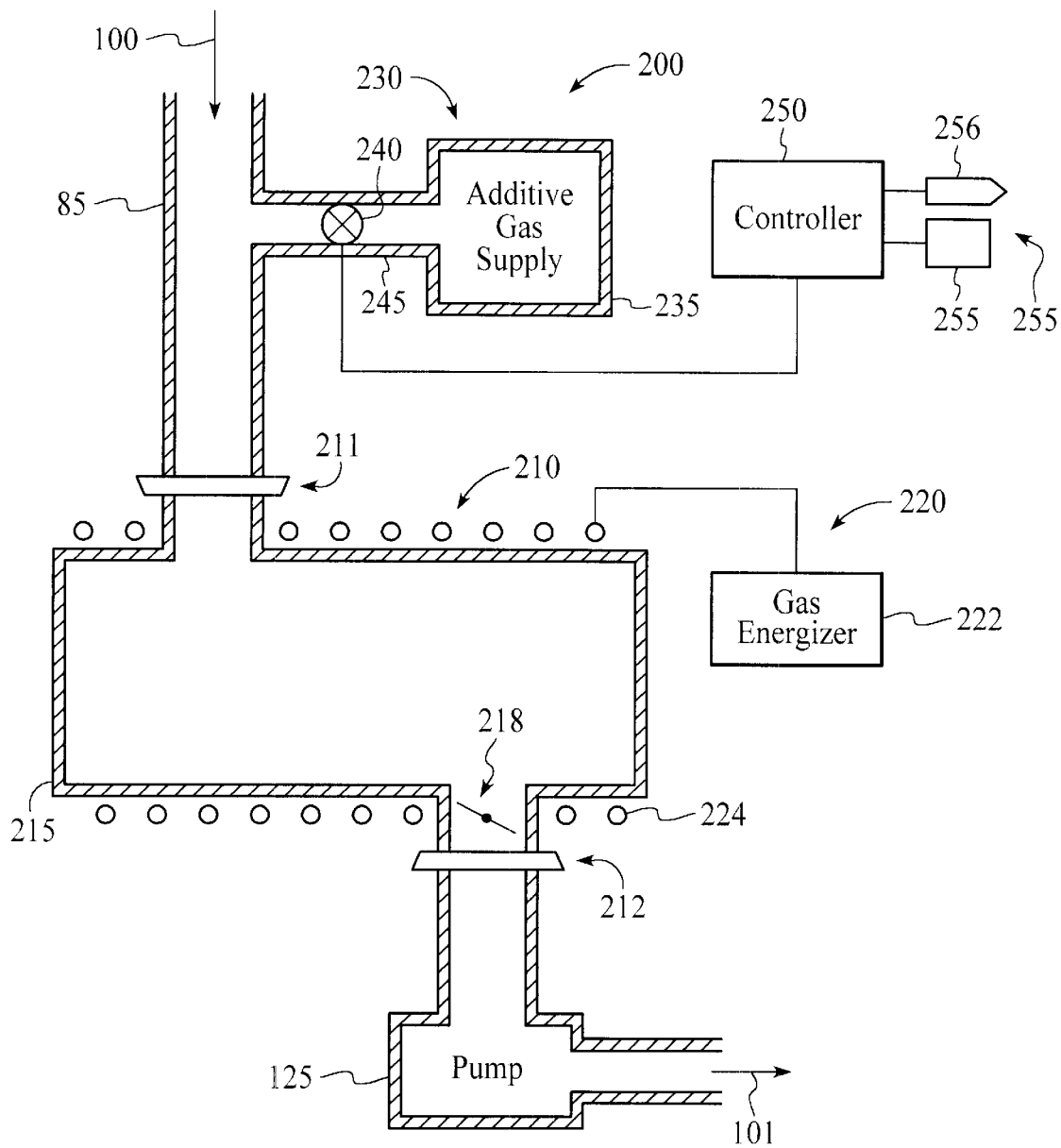
FIG. 2 is a schematic of an embodiment of a gas treatment system with a gas energizing reactor.
Figure 3:
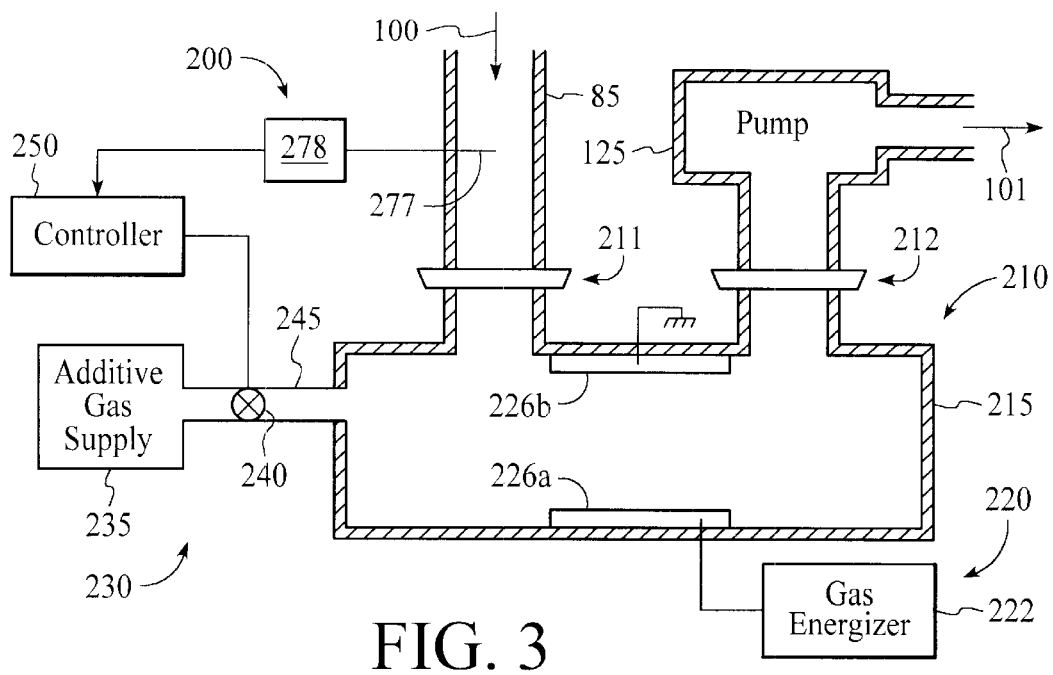
FIG. 3 is a schematic of another embodiment of a gas treatment system with a gas energizing reactor.
Figure 4:
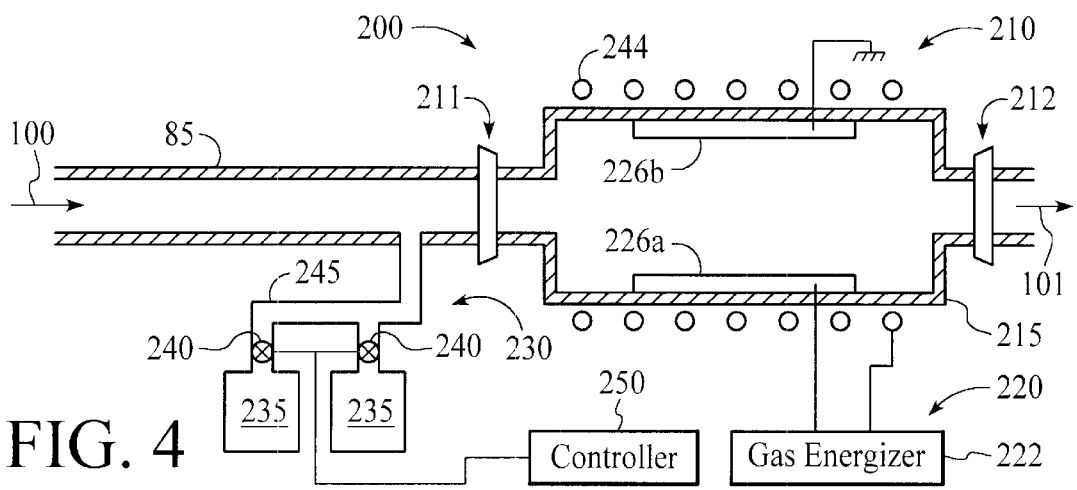
FIG. 4 is a schematic of another embodiment of a gas treatment system with a gas energizing reactor.

The gas energizing system 220 may, in one version, inductively or capacitively couple RF energy to the gas energizing reactor 210 to form charged ionized species in the reactor chamber 215. In the embodiment shown in FIG. 2, the gas energizing system 220 comprises a gas energizer power supply 222 and an inductor antenna 224 around or adjacent to the reactor chamber 215. The gas energizer power supply 222 may comprise an RF energy coupling system including an RF source and an RF match network that supplies a gas energizing RF voltage to the antenna 224 to form an energized gas or plasma in the reactor chamber 215. In an alternative arrangement, such as the one shown in FIG. 3, a pair of electrodes 226a,b can be positioned in the reactor chamber 215 (as shown) or outside the reactor chamber 215 (not shown). The gas energizing system 220 in this embodiment comprises a gas energizer power supply 222 that applies an RF bias voltage to one of the electrodes 226a and the other electrode 226b is maintained at a different potential, such as ground, in order to capacitively couple the electrodes 226a,b. In another alternative configuration, as shown in FIG. 4, a combination of inductively coupled and capacitively coupled energy can be used to energize the effluent 100. One suitable gas energizing reactor 210 and gas energizing system 220 comprises an ASTRON™ Atomic Fluorine Generator, which is available from Applied Science and Technology, Inc., in Woburn, Mass.

The inductively or capacitively operating gas energizing system 220 may be designed to adequately energize the effluent 100 in the reactor chamber 215 to reduce the hazardous gas content therein. In one version, the gas energizer power supply 222 comprises an RF gas energizer capable of producing a power output of at least 500 Watts. The RF gas energizer power supply 222 may have a variable power output which can be remotely adjusted by an operator or a controller from about 500 to about 5000 Watts. The inductor antenna 224 may comprise one or more inductor coils having a circular symmetry with a central axis coincident with the longitudinal axis that extends through the center of the reactor chamber 215. For example, the inductor antenna 224 can comprise a longitudinal spiraling coil that wraps around the reactor chamber 215 to couple RF energy to the effluent 100 traveling through the reactor chamber 215. The inductor antenna 224 may extend across a length that is sufficiently long to energize an extended path-length of effluent gas 100 flowing through the reactor chamber 215 to abate substantially all the hazardous gas species in the effluent 100, as the effluent 100 flows through the gas energizing reactor 210. Optionally, the inductor antenna 224 can be located inside the reactor chamber 215. In the version shown in FIGS. 3 and 4, the electrodes 226a,b have a symmetry with a central axis coincident with the longitudinal axis that extends through the center of the reactor chamber 215. In one version, the electrodes 226a,b comprise flat parallel plates separated by a distance that is sufficiently small to couple energy into the effluent gas 100 flowing between the plates 226a,b. In another version, the electrodes 226a,b comprise opposing semi-cylindrical curved plates that are aligned on the walls of the reactor chamber 215. As with the inductor antenna 224, the length of each of the facing electrodes 226a,b is sufficiently long to energize an extended path-length of effluent gas 100 that flows through the gas energizing reactor 210 to abate substantially all the hazardous gas species in the effluent 100.

Figure 5:
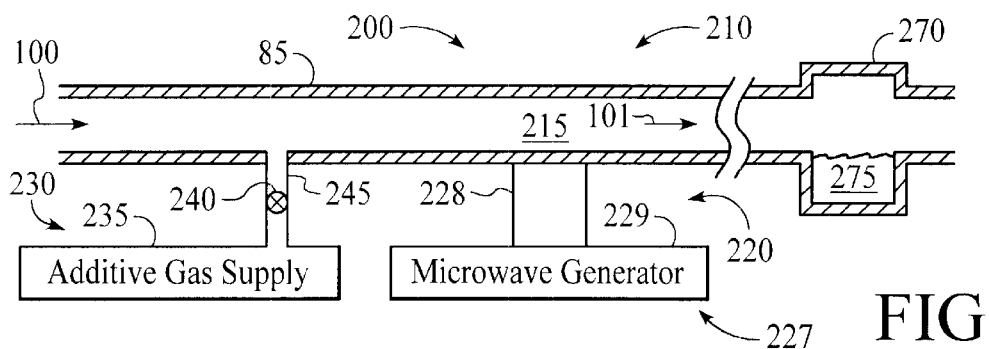
FIG. 5 is a schematic of another embodiment of a gas treatment system with a gas energizing reactor.

In another version, the gas energizing system 220 comprises a gas activator 227 that provides microwaves that chemically activate the effluent gas 100 in the reactor chamber 215 by formation of a highly dissociated gas. In this version, as schematically illustrated in FIG. 5, the gas activator 227 comprises a microwave waveguide 228 powered by a microwave generator 229, such as an "ASTEX". Microwave Plasma Generator commercially available from the Applied Science & Technology,.Inc., Woburn, Mass. Typically, the microwave generator 229 comprises a microwave tuning assembly and a magnetron microwave generator capable of generating microwaves at a frequency of 2.54 Ghz. Typically, the magnetron comprises a high power microwave oscillator in which the potential energy of an electron cloud near a central cathode is converted into microwave energy in a series of cavity resonators spaced radially around the cathode. The resonant frequency of the magnetron is determined by the physical dimensions of the resonator cavities. The waveguide 228 may have a rectangular cross-section, the interior dimensions of which are selected to optimize transmission of radiation at a frequency corresponding to the operating frequency of the microwave generator. For example, for a microwave generator operating at 2.45 GHz, the waveguide 228 forms a rectangle of 5.6 cm by 11.2 cm. The tuning assembly may comprise a short segment of waveguide (not shown) that is closed on one end, and that is positioned on the opposite side of the reactor chamber 215 from and in line with the waveguide 228. A plunger (not shown) may be used to alter the axial length of a cavity defined by the tuning assembly to vary the point at which the electromagnetic field is concentrated. This plunger is not meant to be moved during routine operation, rather it is positioned during initial startup to attain highest possible electric field inside the reactor chamber 215.

The components of the gas treatment system 200 comprise inner or gas contacting surfaces composed of gas impermeable material that has sufficient strength to withstand operating vacuum type pressures of $10^{-7}$ Torr. In addition, the inner surfaces are made from material that is resistant to erosion from the energized effluent 100 in the system 200, and that withstands the high operating temperatures associated with conventional process chambers 25. The reactor chamber 215 may also have a transparent window that is transparent to the radiation coupled to the effluent. The reactor chamber 215 can be composed of a ceramic material such as quartz (silicon dioxide) or polycrystalline aluminum oxide.

The gas energizing reactor 210 may be designed to maximize the energy applied to the effluent 100 in the gas treatment system 200, and to allow the effluent to flow through the gas treatment system 200 in a continuous stream of effluent 100. The shape and size of the reactor chamber 215 may be selected to provide unrestricted and continuous flow of effluent from the process chamber 25 while preventing back diffusion of the effluent 100 into the process chamber 25. The exhaust tube 85 and reactor chamber 215 may comprise a cross-sectional area (in a plane perpendicular to the flow of effluent 100) that is sufficiently large to flow the effluent gas 100 at a rate that is equal to or greater than the rate at which process gas is supplied to the chamber, otherwise, a back pressure of process gas is formed in the process chamber 25. In one version, the exhaust tube 85 and reactor chamber 215 comprise a diameter of at least about 5 mm, and more preferably of at least about 35 mm. The reactor inlet 211 and the reactor outlet 212 in the reactor chamber 215 may be offset, as shown for example in FIGS. 2 and 3, to increase the residence time of the effluent 100 in the reactor chamber 215, or may be linearly oriented, as shown for example in FIG. 4, to reduce hindrance to the flow of effluent 100 therethrough and thereby further prevent the backflow of effluent 100 into the process chamber 25. In one version, a throttle valve 218 may be provided in or near the reactor chamber 215 to control the flow of effluent 100 in and out of the gas energizing reactor 210. The throttle valve 218 may optionally be under the control of a controller. In yet another version, a throttle valve or a one-way valve may be provided at or near the inlet 211 to prevent the backflow of effluent 100.

In one version, the reactor chamber 215 comprises a hollow cylinder having a longitudinal central axis that is oriented parallel to the direction of the flow path of effluent 100, and which can be easily adapted to existing process chamber designs. The length of the plasma reactor is sufficiently long to allow the effluent to remain resident in the tube for a sufficient time to abate substantially all of the hazardous gas content of the effluent. The precise length of the reactor chamber 215 depends on a combination of factors including the diameter of the exhaust tube, the composition and peak flow rate of the effluent 100, and the power level applied to the abatement plasma. For an effluent 100 comprising $CF_4$ and $O_2$ at total flow of about 1000 sccm, and an RF gas energizer power supply 222 operated at about 1500 Watts, a sufficient resident time is at least about 0.01 seconds, and more preferably about 0.1 seconds. A suitable length of reactor chamber 215 that provides such a residence time, comprises a cylindrical tube having a cross-sectional diameter of 35 mm, and a length of from about 20 cm to about 50 cm.

In an embodiment of the gas treatment system 200 shown in FIG. 5, the exhaust tube 85 serves as the reactor chamber 215. The exhaust tube 85 in this embodiment comprises an enclosed conduit through which a continuous stream of effluent 100 flows as the effluent 100 is energized by the gas energizing system 220 to abate the hazardous gas content of the effluent 100. The exhaust conduit 85 has an inlet that forms a gas tight seal with an exhaust port of the process chamber 25, and an outlet that forms a gas tight seal with pump 125 or with an intermediate member. The inner surfaces of the exhaust tube 85 are composed of gas impermeable material that has sufficient strength to withstand operating vacuum type pressures of $10^{-7}$ Torr. In addition, the inner surfaces are made from material that is resistant to erosion from the energized effluent 100 in the tube, and that withstands the high operating temperatures of conventional process chambers. The exhaust tube 85 may also have a transparent window that is transparent to the radiation coupled to the effluent, such as the microwave or RF radiation. The exhaust tube 85 can be composed of a ceramic material such as quartz (silicon dioxide) or polycrystalline aluminum oxide.

In one version, the reactor chamber 215 and/or the exhaust tube 85 is made from monocrystalline sapphire, which is single crystal alumina that exhibits high chemical and erosion resistance in erosive gaseous environments, especially effluent gases that contain fluorine-containing compounds and species. The monocrystalline sapphire provides a unitary structure having a chemically homogeneous composition that has several advantages over polycrystalline materials. The term "monocrystalline" commonly refers to a single crystal material or one that comprises a few large ceramic crystals that are oriented in the same crystallographic direction, i.e., having crystallographic planes with miller indices that are aligned to one another. The ceramic crystals in the monocrystalline sapphire reactor chamber 215 are oriented in substantially the same single crystallographic direction, and provide exposed surfaces having little or no impurity or glassy grain boundary regions that can erode rapidly in erosive fluorine-containing environments. The continuous and uniform crystallographic structure provided by the monocrystalline sapphire exhibits reduced erosion or particulate generation. In addition, monocrystalline sapphire has a high melting temperature that allows use of the reactor chamber 215 at high temperatures exceeding 1000° C. or even exceeding 2000° C.

In one embodiment, the exhaust tube 85 and/or the reactor chamber 215 is placed in a vertical orientation directly beneath the process chamber 25. This embodiment provides a more laminar and less turbulent flow of effluent along the flow path. The laminar flow eliminates turbulence of the effluent gas flow stream and reduces the possibility that effluent gas will diffuse back into the process chamber 25. In addition, a laminar flow of effluent allows energizing radiation to be coupled in a high strength in the region immediately adjacent to the inner surface of the reactor chamber 215 to form a higher density of energized effluent gas or plasma. Also, because the effluent flows continually and uniformly past the inner surface of the reactor chamber 215, the deposition of byproducts on the inner surface, which would otherwise accumulate and impede the coupling of the ionizing radiation, make it unnecessary to frequently clean the reactor chamber 215.

The gas treatment apparatus 200 of the present invention may also include a cooling jacket (not shown) at least partially enclosing the reactor chamber 215, forming an annulus through which a coolant is passed to remove excess heat generated by the abatement plasma. The material of the cooling jacket is selected to withstand the mechanical and thermal stresses of the application. In one version, the material of the cooling jacket comprises a coefficient of thermal expansion, similar to that of the reactor chamber 215 so that the dimensions of the cooling annulus remain constant. In one version, the cooling jacket further comprises a window of material transparent to microwave and RF radiation so that the gas energizing system 220 can couple the ionizing radiation through the cooling jacket and coolant to the effluent 100 inside the reactor chamber 215. Suitable materials for the cooling jacket include aluminum oxide, quartz, sapphire, and monocrystalline sapphire.

Referring again to FIG. 2, the gas treatment system 200 may further include an additive gas source 230. The additive gas source 230 may comprise an additive gas supply 235 and a control valve 246 in a conduit 245 leading from the additive gas supply 235 to the exhaust tube 85. The operation of the valve 240 may be under the control of a controller 250, as will be described, or may be operated by hand. In alternative versions to the one shown in FIG. 2, the additive gas source 230 may introduce additive gas directly into the reactor chamber 215, as shown in FIG. 3, and/or may comprise multiple gas supplies 235 and valves 240, as shown in FIG. 4.

The additive gas source 230 mixes an additive gas into the effluent gas 100, before, as or after the effluent 100 is energized, to enhance abatement of the hazardous gas emissions. When energized, the additive gas dissociates or forms energized species that react with the energized hazardous gas species to create gaseous compounds that are non-toxic, or soluble and easily removed by a wet scrubber located downstream in the exhaust system. The addition of even a small amount of additive gas to the effluent gas 100 can significantly improve abatement efficiency. The additive gas conduit 245 may be positioned sufficiently close to the inlet of the exhaust tube 85 to allow the additive gas to completely mix with and react with the hazardous gas in the effluent 100. The additive gas conduit 245 may be located less than about 10 cm from the inlet of the exhaust tube 85 and oriented to provide good mixing. Also, the conduit 245 may comprise an injection nozzle outlet that directs the additive gas into the exhaust tube 85, such that the additive gas forms a laminar stream flowing in the same direction as the direction of the laminar flow of the effluent 100, and along the inner surface of the exhaust tube 85.

For example, the outlet of the conduit 245 may be in an angular orientation relative to the interior surface of the exhaust tube 85 to flow the additive gas into the exhaust tube 85 in the same direction as the effluent gas 100. The valve 240 (or mass flow controller) in the additive gas conduit 245 allows an operator or an automatic control system to adjust the volumetric flow of the reagent gas to a level that is sufficiently high to abate substantially all the hazardous gas emissions of the effluent.

The additive gas may comprise one or more reactive gases to improve the hazardous gas reduction efficiency. In one version, the reactive gas comprises an oxygen-containing gas, such as one or more of $O_2$, $O_3$, or the like. The oxygen-containing gas combines with the effluent 100 in the exhaust tube chamber 215. In the reactor chamber 215, the effluent 100 and the additive gas are energized as described above. Disassociated hazardous gases, such as PFCs, are oxidized in the plasma and converted to reaction products, such as $CO_2$ and $COF_2$, that are exhaustible or are treatable for safe exhaustion. For example, the $CO_2$ can be safely exhausted and the $COF_2$ can either be exhausted or scrubbed before being exhausted. A scrubber 270 containing a scrubbing fluid 275, such as $H_2O$, can be provided in the abatement system 200 to convert reaction products in the abated effluent 101 to exhaustible products.

Figure 6:
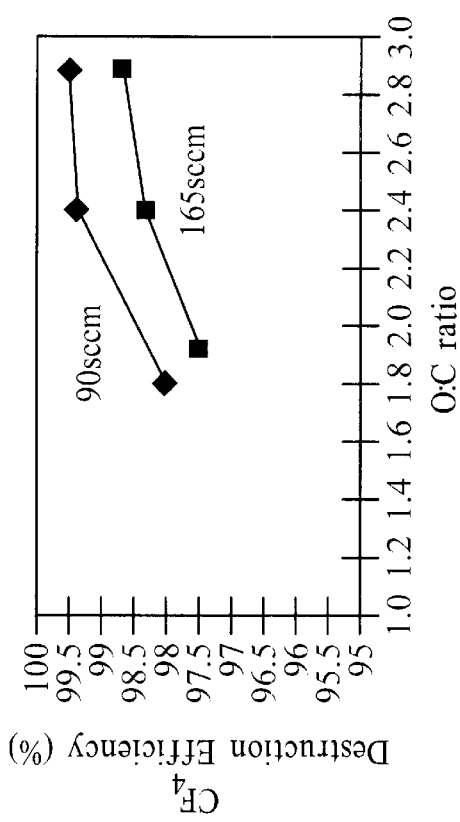
FIG. 6 is a graph showing the hazardous gas reduction efficiency using reactive gases with varying oxygen atom to carbon atom ratios in accordance with an embodiment of a process for reducing hazardous gases.

It has been discovered that by properly selecting the volumetric flow ratio of reactive gas to hazardous gas in the effluent, the hazardous gas reduction efficiency can be substantially improved by an unexpected amount. For example, it has been discovered that when using a reactive gas comprising an oxygen-containing gas the volumetric flow ratio of oxygen atoms in the additive gas to carbon atoms in the effluent 100 should be at least about 2.4:1. FIG. 6 shows a graph of the oxygen to carbon ratio effect on the reduction efficiency of $CF_4$ at $CF_4$ flow rates of 90 sccm and 165 sccm. As shown by the graph, unexpectedly high levels of the PFC reduction occur and level-off at oxygen to carbon ratios of at least about 2.4:1. The same or similar results have been shown for other PFC gases. The expression, "carbon atoms in the effluent" is used throughout in simplified reference to all PFC gases, but it is meant to be interchangeable with "sulfur atoms in the effluent" when sulfur-containing gases, such as $SF_6$ gas, are present and "nitrogen atoms in the effluent" when nitrogen-containing gases, such as $NF_3$ gas, are present.

Accordingly, in one embodiment of the present invention, a reactive gas comprising oxygen-containing gas is introduced into a PFC containing effluent 100 by additive gas source 230 in a volumetric flow ratio selected to provide an oxygen atom in the reactive gas to carbon atom in the effluent ratio of at least about 2.4:1. In one version, the volumetric flow rate of the oxygen-containing gas may be determined by comparing the stoichiometric formula of the oxygen-containing gas to the stoichiometric formula or formulae of the PFC gas or gases. A factor can be calculated by dividing the number of carbon atoms in the PFC formula by the number of oxygen atoms in the oxygen-containing gas formula and multiplying the result by 2.4. This factor can then be used to determine the minimum oxygen-containing gas volumetric flow rate by multiplying the volumetric flow rate of the PFC gas by the factor. In one version, the reactive gas comprises $O_2$, and the volumetric flow rate of the $O_2$ is determined by multiplying the volumetric flow rate of the PFC gas by the appropriate factor to reach an oxygen atom to carbon atom in the effluent ratio of at least about 2.4:1. For example, for single-carbon PFCs, such as $CF_4$, the volumetric flow rate of $O_2$ is at least about 1.2 times the volumetric flow rate of the $CF_4$. For PFCs containing two carbon atoms, such as $C_2F_6$, the volumetric flow rate of $O_2$ is at least about 2.4:1. In another version, the reactive gas in the additive gas comprises ozone, $O_3$. Since ozone contains three oxygen atoms, the minimum volumetric flow ratio of ozone to carbon atoms in the effluent is 0.8:1. Thus, for $CF_4$, the flow of ozone is determined by multiplying the volumetric flow rate of the $CF_4$ gas in the effluent by a factor of 0.8 times the number of carbon atoms in the PFC gas. For non-carbon containing PFCs, such as $SF_6$ and $NF_3$, the respective oxygen to sulfur ratio or oxygen to nitrogen ratio should be at least about 2.4:1.

Exemplary factors for determining the minimum desired flow rate of reactive gas for some PFCs is given in Table 1 below. To utilize the table in accordance with the present inventive aspect, the minimum volumetric flow of the reactive gas is determined by multiplying the volumetric flow of the PFC gas by the corresponding factor in the table. For example, if the effluent 100 contains 100 sccm of $C_2F_6$, then at least about (2.4)(100) or about 240 sccm of reactive gas comprising $O_2$ would be introduced by additive gas supply 230.

TABLE 1

| | single oxygen atom reactive gas | two oxygen atom reactive gas, e.g., $O_2$ | three oxygen atom reactive gas, e.g., $O_3$ | four oxygen atom reactive gas |
|---|---|---|---|---|
| $CF_4$ | 2.4 | 1.2 | 0.8 | 0.6 |
| $CHF_3$ | 2.4 | 1.2 | 0.8 | 0.6 |
| $CH_2F_2$ | 2.4 | 1.2 | 0.8 | 0.6 |
| $CH_3F$ | 2.4 | 1.2 | 0.8 | 0.6 |
| $SF_6$ | 2.4 | 1.2 | 0.8 | 0.6 |
| $NF_3$ | 2.4 | 1.2 | 0.8 | 0.6 |
| $C_2F_6$ | 4.8 | 2.4 | 1.6 | 1.2 |
| $C_3F_8$ | 7.2 | 3.6 | 2.4 | 1.8 |
| $C_4F_8$ | 9.6 | 4.8 | 3.2 | 2.4 |
| $C_4F_6$ | 9.6 | 4.8 | 3.2 | 2.4 |

In instances when the effluent gas 100 comprises more than one type of PFC gas, the minimum flow rate of the reactive gas is determined by summing the minimum flow rates of reactive gas associated with each constituent of PFC gas. For example, in an effluent comprising 45 sccm $CF_4$/45 sccm $CHF_3$/45 sccm $C_2F_6$, reactive gas comprising $O_2$ can be introduced at a flow rate of at least about (1.2)(45)+(1.2)(45)+(2.4)(45), or about 216 sccm. Table 2 gives exemplary minimum flow rates for reactive gases comprising $O_2$ with varying PFCs compositions in the effluent 100.

TABLE 2

| PFCs in Effluent | $O_2$ (sccm) |
|---|---|
| 45 $C_2F_6$/45 $CF_4$ | 162 |
| 80 $C_2F_6$/90 $CF_4$ | 300 |
| 85 $CHF_3$/165 $CF_4$ | 300 |
| 45 $CHF_3$/45 $C_2F_2$/45 $CF_4$ | 216 |

The controller 250 may control the amount of reactive gas in the additive gas that is introduced into the effluent 100. In one version of the invention, the hazardous gas content of the effluent 100 and the volumetric flow rate (or equivalent mass flow rate) of hazardous gas in the effluent 100 is empirically determined for a particular process being performed in the process chamber 25. The controller 250 then causes the additive gas source 230 to introduce additive gas comprising reactive gas at a volumetric flow rate (or equivalent mass flow rate) selected as discussed above based on the gas flow rate empirically determined.

Input devices 255 associated with the controller 250 allow an operator to input data into the controller 250 to control operations or to alter the software in the controller 250. For example, the interface between an operator and the computer system may be a CRT monitor 256 and a light pen 257, as shown in FIG. 2. The light pen 257 detects light emitted by the CRT monitor 256 with a light sensor in the tip of the pen 257. To select a particular screen or function, the operator touches a designated area of the CRT monitor 256 and pushes a button on the pen 257. The area touched changes its color or a new menu or screen is displayed to confirm the communication between the light pen and the CRT monitor 256. Other devices, such as a keyboard, mouse or pointing communication device can also be used to communicate with the controller 250. An operator may use the input devices 255 to input a value, for example, associated with the desired gas flow rate of reactive gas or may input a value associated with a particular process in the process chamber 25. The controller 250 may then perform preprogrammed process code to automatically introduce the desired amount of reactive gas, as will be discussed below.

In another version, a gas analysis probe 277 may be positioned in the exhaust tube 85 between the process chamber and the gas energizing reactor 210 to allow for automatic control of the introduction of additive gas. The gas analysis probe 277 may be in communication with a gas analyzer 278 which provides gas analysis data to the controller 250, as shown for example in FIG. 3. The gas analyzer 278 comprises any commercially available gas analyzer, such as an RGA 300 system available from Stanford Research Systems in Sunnyvale, Calif., that is capable of detecting a volumetric or mass gas flow rate of a particular gas in a gas mixture. The controller 250 monitors the gas flow rates of the PFCs in the effluent 100 and automatically determines the desired volumetric (or equivalent mass) gas flow rate of reactive gas in the additive gas to introduce into the effluent 100 in accordance with program code. For example, if the gas analyzer 278 provides a signal indicating that the effluent 100 contains 100 sccm of $CF_4$, then the controller 250 would automatically cause the introduction of at least about 120 sccm of $O_2$ into the effluent 100. If the gas analyzer detects a mixture of PFC gases, then the controller 250 will calculate the desired reactive gas flow rate in the additive as discussed above.

The additive gas may additionally or alternatively comprise one or more inert or non-reactive gases, such as inert gases like Ar, Ne, He, Xe, or the like, or non-reactive or carrier gases such as hydrogen-containing gas or hydrogen and oxygen containing gas. By "non-reactive" gas it is meant one or more gases that are less reactive with the effluent 100 than the reactive gas, including inert and non-inert gases. The non-reactive gas may assist in transporting the reactive gas to the reactor chamber 215 and/or may aid in striking and sustaining a plasma in the reactor chamber 215 or initiating and stabilizing activated gaseous species in the reactor chamber 215.

It has been further discovered that high inert or non-reactive gas volumetric flow rates can reduce the effectiveness of hazardous gas reduction, such as PFC reduction, in a gas energizing reactor 210. This is believed to be due to excess inert or non-reactive gas stealing power from the energized gas and thereby preventing maximum reduction of the hazardous gas by the reactive gas. Thus, in one embodiment, the volumetric flow of inert or non-reactive gas to reactive gas in the additive gas is less than 3:1. In another version, the volumetric flow ratio of inert or non-reactive gas to reactive gas is less than about 2:1. Suitable ranges of volumetric flow ratios of inert or non-reactive gas to reactive gas for sufficient reduction of hazardous gases has been discovered to be from about 1:1 to about 2.9:1, and more preferably from about 1.5:1 to about 2:1.

Figure 7:
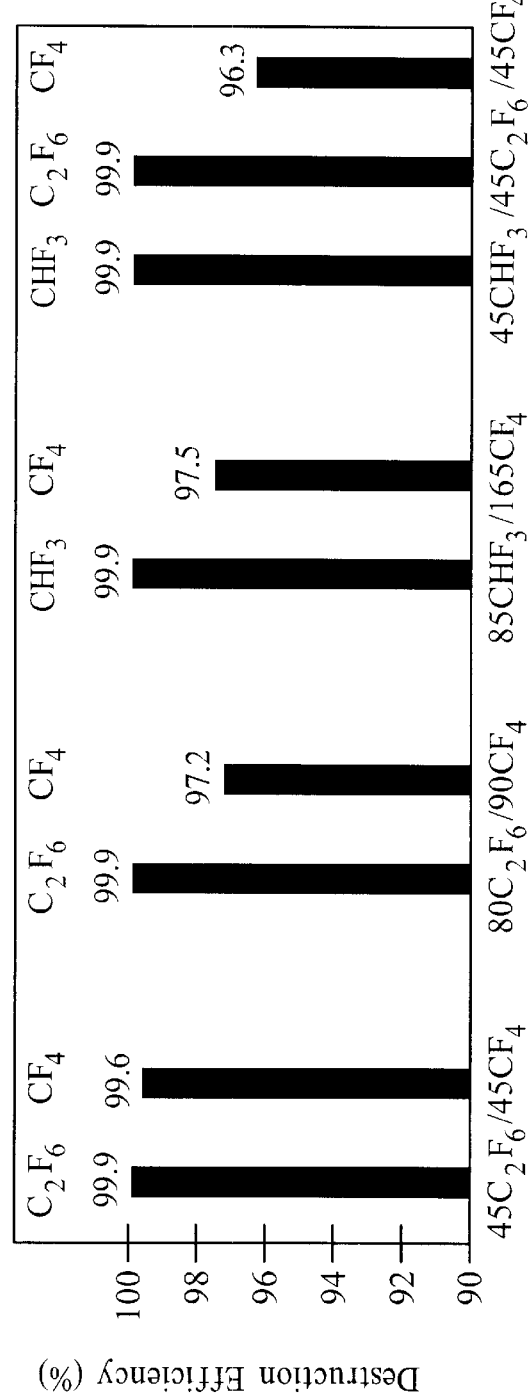
FIG. 7 is a bar graph showing the hazardous gas reduction efficiency for effluents comprising mixtures of hazardous gas using an embodiment of a process for reducing hazardous gases.

In one particular embodiment, an additive gas comprising an inert gas, such as Ar, and a reactive gas, such as an oxygen containing gas is introduced into an effluent 100 containing one or more PFC gases. In this embodiment, the volumetric flow rate of the reactive gas is selected so that the ratio of oxygen atoms in the reactive gas to carbon atoms in the PFC gases is at least about 2.4:1. The volumetric flow rate of inert gas is selected so that the volumetric flow ratio of the inert gas to the reactive gas is from about 1.5:1 to about 2:1, more preferably about 1.8. FIG. 7 shows the reduction efficiency of this embodiment when used to abate four different effluent 100 gases having the following PFC mixtures therein: 45 sccm $C_2F_6$/45 sccm $CF_4$; 80 sccm $C_2F_6$/90 sccm $CF_4$; 85 sccm $CHF_3$/165 sccm and 45 sccm $CHF_3$/45 sccm $C_2F_6$/45 sccm $CF_4$. As can be seen, in all cases, the non-$CF_4$ PFC gases were reduced by 99.9%, and the $CF_4$ gases were reduced by at least 96%.

Figure 8:
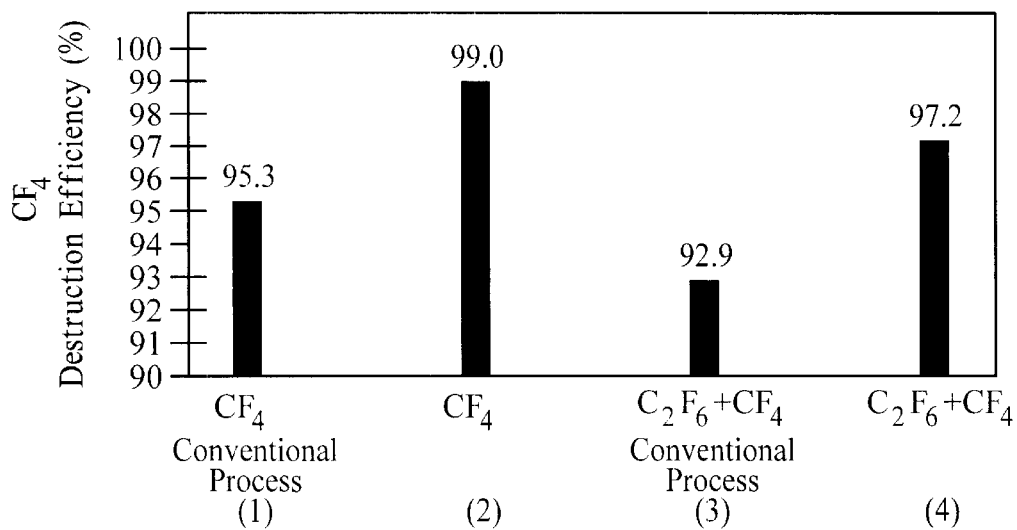
FIG. 8 is a bar graph showing a comparison of the reduction efficiency of a hazardous gas containing effluent using a conventional process and using an embodiment of a process for reducing hazardous gases.

These results represent significant improvements in reduction of hazardous gases, such as PFCs, over conventional techniques. FIG. 8 shows a comparison of the $CF_4$ reduction efficiency of the present process, (2) and (4), with the $CF_4$ reduction efficiency of the conventional process, (1) and (3), which uses additive gas Ar and $O_2$ in a volumetric flow ratio of Ar to $O_2$ of at least 3:1. The reduction efficiency of $CF_4$ for an effluent 100 comprising $CF_4$ and for an effluent comprising $C_2F_6$ and $CF_4$ increases by about 4% or better when reduced using the present process. Thus, consistent 95% reduction of all PFCs is achieved by the present process and consistent 99% reduction of non-$CF_4$ PFC gases is achieved.

Figures 9A, 9B:
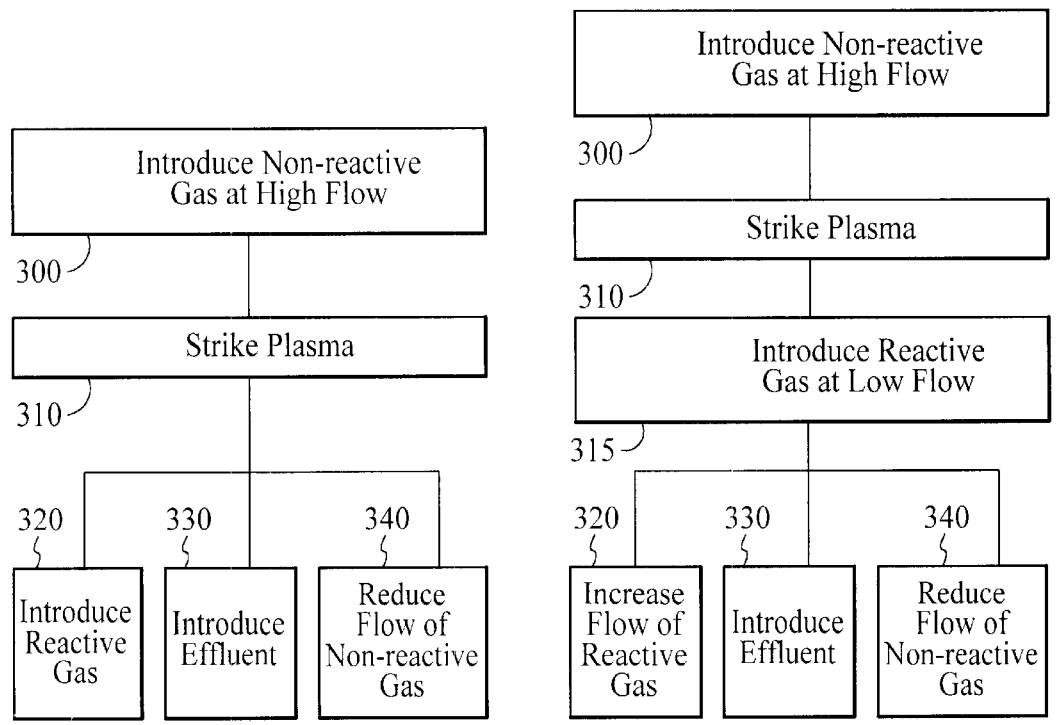
FIGS. 9a and 9b are flow charts showing different embodiments of processes for reducing hazardous gases.

It has further been discovered that the striking of and the stabilization of a plasma or activated gas can be difficult in some gas energizing reactors 210 when the volumetric flow ratio of inert or non-reactive gas to reactive gas is less than 3:1, and can be even more difficult when the ratio is less than about 2:1. To counter this difficulty, a multi-step process has been discovered that allows for adequate striking and stabilization of a plasma of effluent and additive gas while also allowing for reduced volumetric flow ratios of inert or non-reactive gas to reactive gas. In one embodiment of the multi-step process, as shown in the flowchart of FIG. 9a, an inert gas, such as Ar, is initially introduced into the reactor chamber 215 at a high flow rate 300. The high flow of inert gas is energized by gas energizing system 220 to strike a plasma 310. Once the plasma is adequately sustained, the desired flow of reactive gas is introduced 320, the effluent 100 is introduced 330, and the flow of inert gas is reduced 340 to a value where the volumetric flow ratio of inert or non-reactive gas to reactive gas is at the desired ratio. Steps 320, 330, and 340 can occur simultaneously or in any sequence. In one version, the reactive gas in step 320 is introduced in a manner that the ratio of oxygen atoms in the reactive gas to the carbon atoms in the effluent is at least about 2.4:1. In another embodiment of the multi-step process, as shown in FIG. 9b, an intermediate step 315 of introducing a relatively low flow of reactive gas has been discovered to allow for effectively and consistently sustained and stabilized plasma throughout the hazardous gas reduction process. In one version, the flow rate of reactive gas during the intermediate step is from about 10% to about 90% of the flow rate of reactive gas during step 320, and more preferably from about 20% to about 50%. In addition, this plasma striking method has been shown to be beneficial in situations where no reactive gas is added.

Some hazardous gases, such as $CHF_3$, are efficiently reduced merely by energizing the effluent. In other versions, the effluent may be energized and then subsequently treated, such as by passing the energized gas over a catalytic bed or passed the energized gas over a consumable liner.

The following is merely an example of a process for reducing a PFC content of an effluent 100, and is not intended to limit the invention. This exemplary process may be used to reduce an effluent 100 comprising 45 sccm $CHF_3$/45 sccm $CF_4$/45 sccm $C_2F_6$. In step 300, additive gas comprising Ar gas is introduced from additive gas source 230 at a volumetric flow rate (or an equivalent mass flow rate) from about 600 sccm to about 900 sccm to strike a plasma 310 in the reactor chamber 215. In step 315, $O_2$ at a flow of from about 50 sccm to about 70 sccm is introduced into the reactor chamber 215 for at least about 1 second and more preferably is introduced from about 5 seconds to about 10 seconds. Thereafter, the flow of $O_2$ is increased 320 to about 220 sccm, the effluent 100 is introduced 330, and the flow of Ar is reduced 340 to about 400 sccm. Thus, the O:C ratio is at least about 2.4:1 and the Ar to $O_2$ volumetric flow ratio is about 1.8.

The controller 250 may control the composition of and the flow rates of the gases in the additive gas that are introduced into the effluent 100 by additive gas source. Although the controller 250 is illustrated by way of an exemplary single controller device to simplify the description of present invention, it should be understood that the controller 250 may be a plurality of controller devices that may be connected to one another or a plurality of controller devices that may be connected to different components of the chamber 25 and/or the abatement system 200.

In one embodiment, the controller 250 comprises electronic hardware including electrical circuitry comprising integrated circuits that is suitable for operating the additive gas source 230. In another version, the controller 250 is also suitable for controlling the chamber 25 and its peripheral components. Generally, the controller 250 is adapted to accept data input, run algorithms, produce useful output signals, and may also be used to detect data signals from the detectors and other chamber components, and to monitor or control the process conditions in the chamber 25. For example, the controller 250 may comprise (i) a computer comprising a central processor unit (CPU) which is interconnected to a memory system with peripheral control components, (ii) application specific integrated circuits (ASICs) that operate particular components of the chamber 25, and (iii) one or more controller interface boards along with suitable support circuitry. Typical central CPUs include the PowerPC™, Pentium™, and other such processors. The ASICs are designed and preprogrammed for particular tasks, such as retrieval of data and other information from the chamber, or operation of particular chamber components. Typical support circuitry include for example, co-processors, clock circuits, cache, power supplies and other well known components that are in communication with the CPU. For example, the CPU often operates in conjunction with a random access memory (RAM), a read-only memory (ROM) and other storage devices well known in the art. The RAM can be used to store the software implementation of the present invention during process implementation. The programs and subroutines of the present invention are typically stored in mass storage devices and are recalled for temporary storage in RAM when being executed by the CPU.

The software implementation and computer program code product of the present invention may be stored in a memory device, such as a floppy disk or a hard drive, and called into RAM during execution by the controller 250. The computer program code may be written in conventional computer readable programming languages, such as for example, assembly language, C, $C^{++}$, or Pascal. Suitable program code is entered into a single file, or multiple files, using a conventional text editor and stored or embodied in a computer-usable medium, such as a memory of the computer system. If the entered code text is in a high level language, the code is compiled to a compiler code which is linked with an object code of precompiled windows library routines. To execute the linked and compiled object code, the system user invokes the object code, causing the computer system to load the code in memory to perform the tasks identified in the computer program.

Figure 10:
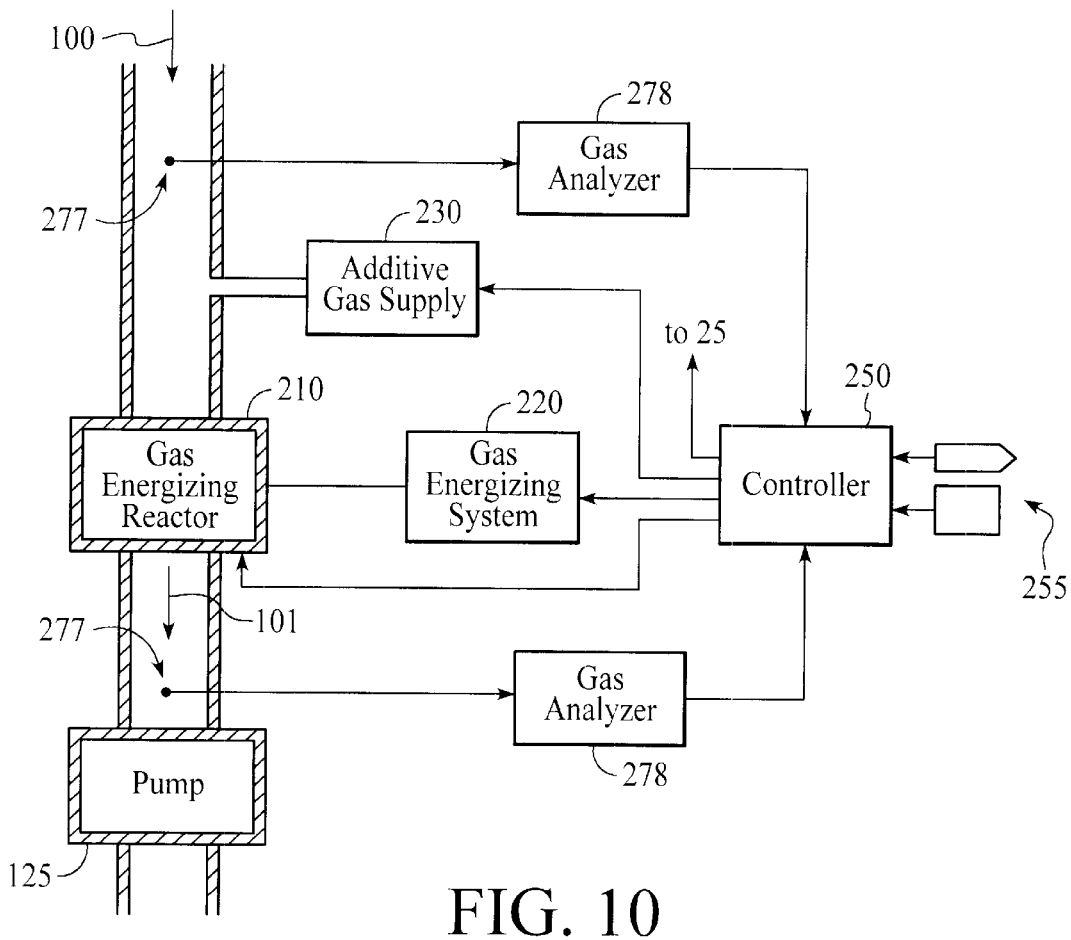
FIG. 10 is a schematic of another embodiment of a gas treatment system with a gas energizing reactor and a controller.

As shown in FIG. 10, the controller 250 may control operation of the gas treatment system 200 including controlling the additive gas source 230, the gas energizing reactor 210, and the gas energizing system 220. The controller 250 may control operation of the devices in accordance with one or more sets of computer instructions that dictate the timing, additive gas compositions and flow rates, reactor chamber pressure and temperature, power levels of the gas energizing system 220, and other process parameters.

Figure 11:
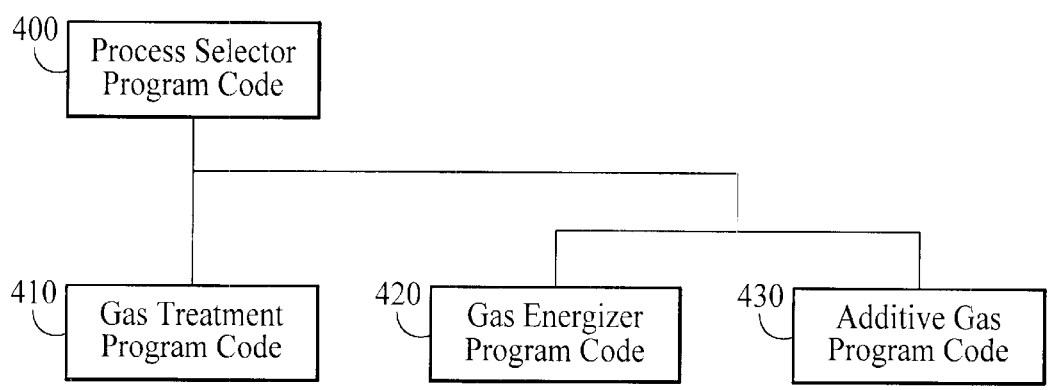
FIG. 11 is illustrative of a block diagram showing a computer program product for operating a controller according to an embodiment of the present invention.

One version of the computer program code, as illustrated in FIG. 11, comprises multiple sets of program code instructions, such as a process selector and sequencer program code 400 that allows an operator to enter and select a process recipe, and that executes operation of the process recipe in a reactor chamber 215 and gas treatment program code 410 for operating and managing priorities of the chamber components in the reactor chamber 215. While illustrated as separate program codes that perform a set of tasks, it should be understood that these program codes can be integrated, or the tasks of one program code integrated with the tasks of another program code to provide a desired set of tasks. Thus the controller 250 and program code described herein should not be limited to the specific embodiment of the program codes described herein or housed as shown herein, and other sets of program code or computer instructions that perform equivalent functions are within the scope of the present invention.

In operation, a user enters a selected process into the process selector program code 400 via the input devices 255. The process may include i) a manual process where the specific additive gases, additive gas volumetric flow rates, and the timing thereof is manually entered into the controller 250 by input devices, for example: ii) an automatic process where a value associated with a particular process chamber 25 process, such as an etching process, a CVD process, or any other substrate fabrication process or a chamber cleaning process, is entered and an automatic or preprogrammed operation of the gas treatment system 200, including the timing, composition, and volumetric flow rates of additive gas, is performed; or iii) a monitoring process where the controller 250 is instructed to detect effluent gas 100 composition and volumetric flow rates via gas analyzer 278 and gas analysis probe 277 and to control the operation of the gas treatment system 200 in relation to the detected values.

Figure 12:
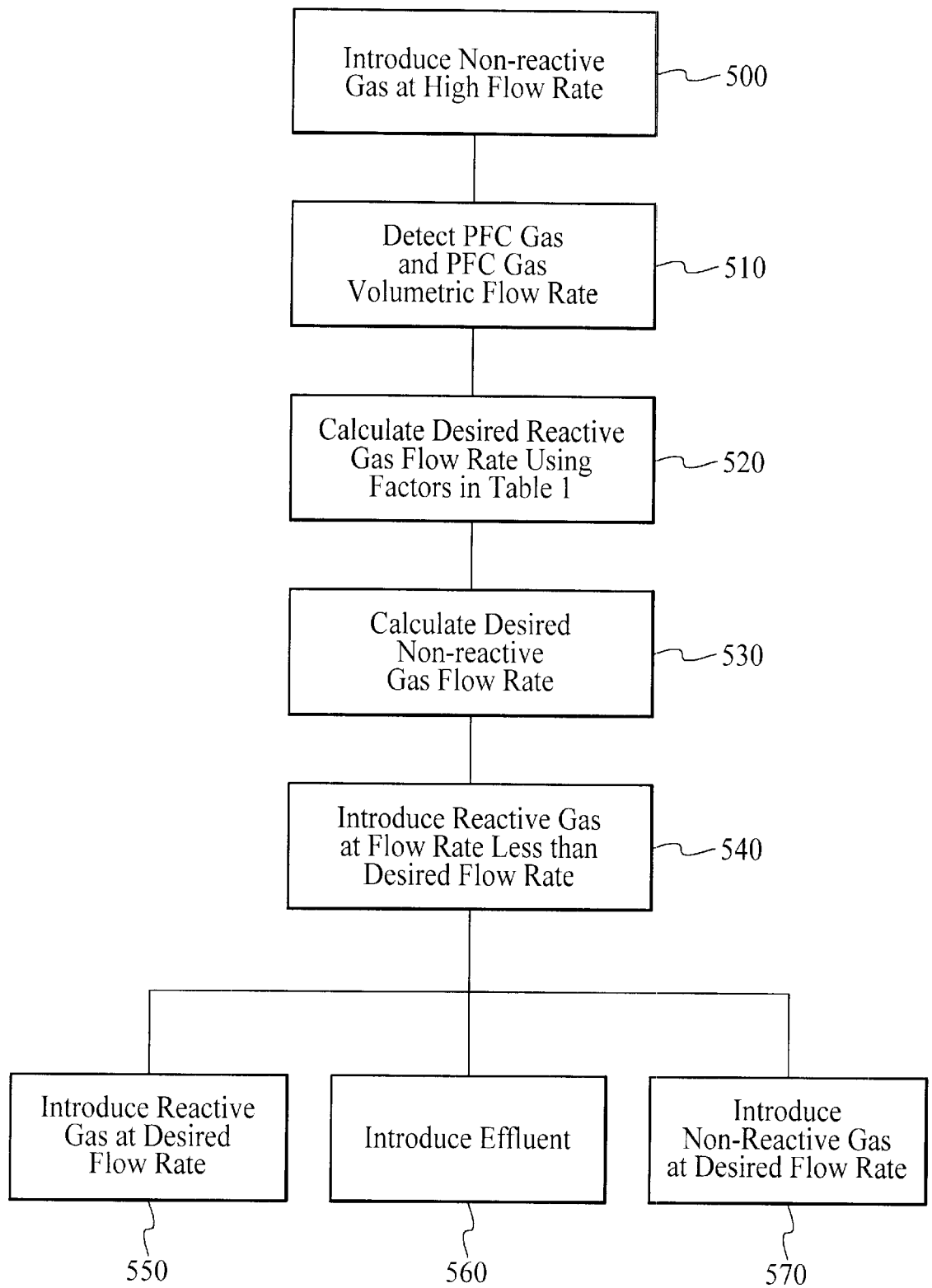
FIG. 12 is a flow chart showing an embodiment of a process for treating an effluent containing hazardous gas.

FIG. 12 shows a flow chart of one version of code instructions that may be performed in the third situation. Initially inert gas is introduced into the reactor chamber 215 at a high flow rate to strike a plasma 500. Before, after or during step 500, the controller 250 and gas analyzer 278 detect the PFC gases in the effluent 100 and detect the volumetric or mass flow rates of the PFC gases 510. The controller 250 then uses the detected information from step 510 to calculate the desired reactive gas, such as $O_2$, flow rate 520 by multiplying the PFC flow rate by the factor given in Table 1 and calculates the desired inert gas flow rate 530 by multiplying the desired reactive gas flow rate by a value less than 3, by a value less than 2, or by a value of about 1.8. Once the plasma is sustained, the reactive gas, such as $O_2$, is introduced 540 at a volumetric flow rate determined by multiplying the desired reactive gas flow rate by a value from about 0.25 to about 0.33. Thereafter, the reactive gas is introduced at the desired flow 550, the effluent 100 is introduced into the reactor chamber 215, and the flow of inert gas is reduced to the desired level calculated in step 530. Steps 550, 560, and 570 may be performed simultaneously or in any order.

The process selector program code 400 executes the process set by passing the particular process set parameters to the gas treatment program code 410 which controls multiple processing tasks in the gas treatment apparatus 200 according to the process set determined by the process selector program code 400. The gas treatment program code 410 controls execution of various gas treatment program code instructions sets which control operation of the gas treatment components. In operation, the gas treatment program code 410 selectively calls the gas treatment component instruction sets in accordance with the particular process set being executed, schedules the chamber component instruction sets, monitors operation of the various chamber components, determines which component needs to be operated based on the process parameters for the process set to be executed, and causes execution of a chamber component instruction set responsive to the monitoring and determining steps. The gas energizer program code 420 includes, for example, program code instruction sets for adjusting levels of the source or bias power applied to operate the reactor chamber 215. The additive gas program code 430 includes program code instruction sets for controlling the gas composition and flow levels passed through the chamber by adjusting the opening of one or more gas valves 240 in the gas supply 230. FIG. 11 merely shows examples of a program code configuration.

In another version, the controller 250 may be further adapted to assure sufficient abatement of the hazardous gases in the effluent 100 by the gas treatment system 200 and/or to monitor the functioning of the system. In this embodiment, the gas treatment system 200 comprises a control and monitoring system including the controller 250 or a separate controller. As shown in FIG. 10, a gas analysis probe 470 may be positioned in the abated effluent stream, preferably downstream of the gas energizing reactor 210, to analyze the gas content of the abated effluent 101. The gas analysis probe 470 is in communication with gas analyzer 475. Gas analyzer 475, which may be of the type described above, provides gas analysis data to controller 250. Pressure monitors and temperature monitors may also be provided to provide data to the controller 250 about the pressure and temperature conditions in the gas treatment system 200. The controller 250 may control and adjust the operation of the gas treatment system 200 and, optionally, of process chamber 25 in accordance with the monitored data, as disclosed in U.S. patent application Ser. No. 09/363,302, filed on Jul. 28, 1999, and in U.S. patent application Ser. No. 09/363,250, filed on Jul. 28, 1999, both of which are incorporated herein by reference.

In operation, the gas analyzer 475 may continuously monitor the hazardous gas content of the abated effluent 101 emitted from the gas treatment system 200 and provides a continuous output signal, or a safety level output signal, that is triggered when the hazardous gas content of the abated effluent 101 exceeds a safety level. The controller 250 comprises a computer readable medium having computer readable program code embodied therein that monitors the output signal(s) from the gas analyzer and performs at least one of the following steps: (i) adjusts the power or other parameter of the gas energizing reactor 210, (ii) adjusts the quantity or composition of the additive gas, (iii) adjusts process conditions in the process chamber 25, (iv) terminates a process in the process chamber 25; (v) diverts the flow of effluent from the process chamber 25 away from the gas treatment system 200 by causing a valve control system to open a diversion valve (not shown) and close an abatement valve (not shown), and (vi) provides an alarm signal to notify an operator of dangerously high levels of hazardous gas in the effluent or of an inoperative condition in the gas treatment system 200 through a monitor or a separate alarm. Step (v) above is advantageous in that it allows for the gas treatment system 200 to be changed periodically or during inoperativeness without shutting down the substrate processing in the chamber 25.

In this regard, the gas treatment program code 410 may comprise a gas analyzer program code to monitor the composition or concentration of hazardous gas in the abated effluent 101 as determined by the gas analyzer 475, and receives the output signals of the hazardous gas content and composition (or the safety level output signal) from the gas analysis probe 470. The gas analyzer program code stores the output signals in an Effluent Gas Composition Table that is periodically surveyed by the other program code instruction sets. Alternatively, or in combination with the storage function, the gas analyzer program code passes a safety level output signal to other program code instructional sets, when the hazardous gas content in the effluent gas exceeds a predefined operational safety level. The gas analyzer program code can also be integrated into the gas analyzer 475, instead of being resident in the controller 250.

The gas treatment program code 410 may further comprise a safety operational program code. The safety operational program code operates in conjunction with the other program code instruction sets to adjust operation of the process chamber components or the gas treatment apparatus in relation to the levels of hazardous gas in the abated effluent stream 101 to reduce or eliminate the hazardous gas emissions. For example, the safety operational program code can be programmed to shut-down operation of the process chamber 25 upon detection of a predefined concentration of hazardous gas in the exhaust effluent, or of the presence of toxic hazardous gas even in minute trace levels in the effluent. Typically, when toxic gases are used in the processing of the substrate, several safety shut-off valves are on each gas supply line of the gas distributor 72, in conventional configurations. The safety operational program code provides a trigger signal to the process gas control instructions set of the gas treatment program code 410 to close the safety shut-off valves when the concentration of hazardous gas in the abated effluent 101 reaches a predefined level. Alternatively, the safety operational program code can divert the flow of effluent to the exhaust or to another abatement system, as discussed above. Conversely, when the safety operational program code receives a low or zero emissions level signal from the output of the gas analyzer 475, the program code provides a control signal that instructs the gas treatment program code 410 to continue to operate the process chamber 25 in the current operational mode, and that also instructs the gas treatment system 200 to continue to operate in its current operational mode.

In operation, the safety operational program code repeatedly reads the latest abated effluent gas composition in the Effluent Gas Composition Table, compares the readings to a signal from the mass flow controllers controlling process gas flow into the chamber 25, and sends instructions to adjust the flow rates of the process gas as necessary to reduce or substantially entirely eliminate the hazardous gas emissions in the effluent. Alternatively, the safety operational program code performs these operations when it receives a safety level output signal. Typically, this program code is set to operate when the concentration of hazardous gas in the effluent exceeds a predetermined value, such as a concentration of from about 0.1% to about 10%.

In another example, the safety operational program code can also operate an alarm or an indicator, such as a LED light, to indicate a dangerous level of toxic or hazardous gas in the effluent gas stream; or provide a metering display, such as a graphic real-time image that shows in real time the level of emissions of hazardous gas for monitoring by an operator. This safety feature allows an operator to monitor and prevent accidental emissions of hazardous gas into the atmosphere. The same signal can be used to maintain the processing apparatus 25 in a non-operational mode, or to energize the safety shut-off valves when an unsafe process condition is detected. In this manner, the safety operational program code operates the process chamber and the gas treatment apparatus to provide an environmentally safe apparatus.

During operation of the gas treatment apparatus 200 in a typical fabrication process, a substrate 30, such as a semiconductor wafer, is placed on the support 40 in the process chamber 25, and a process gas comprising fluorine-containing gas such as $CF_4$, $C_2F_6$, $C_3F_8$, $CHF_3$, $SF_6$, $NF_3$, $CH_3F$, and the like, is introduced into the process zone 35 through the process gas distributor 72. The process gas is energized by the gas energizer 60 in the chamber 25 to process the substrate 30 in an RF or electromagnetic plasma gas or a microwave energized gas. Alternatively, the gas may be energized in a remote chamber. During and after processing, an effluent gas stream of spent process gas and gaseous byproducts are exhausted from the process chamber 25 through the exhaust tube 85 of the exhaust system 80 and gas treatment apparatus 200.

In the gas treatment system 200, an additive gas comprising a reactive gas, and optionally an inert or non-reactive gas is introduced into the effluent 100, and discussed above, and in the reactor chamber 215, an RF energy or microwave energy, is coupled to the effluent 100 and additive gas flowing from the exhaust tube 85, to form an abatement plasma in which hazardous gas components in the effluent 100 are dissociated or reacted with one another to substantially abate the hazardous gas content of the effluent 100. The radiation raises the energy of some electrons of the atoms of the effluent gas molecules to energies from 1 to 10 eV, thereby freeing electrons and breaking the bonds of the gas molecules to form dissociated atomic gaseous species. In an energized plasma gas, avalanche breakdown occurs in the gaseous stream when the individual charged species electrons and charged nuclei are accelerated in the prevalent electric and magnetic fields to collide with other gas molecules causing further dissociation and ionization of the effluent gas 100. The ionized or dissociated gaseous species of the energized effluent react with each other, or with other non-dissociated gaseous species, to form non-toxic gases or gases that are highly soluble in conventional gas scrubbers. For example, PFC containing effluent may be mixed with an oxygen-containing gas, such as $O_2$ gas, and passed through the reactor chamber 215. The gas 101 exiting the gas energizing reactor 210 has been determined to have a greater than about a 95 percent reduction of the PFC gases from the effluent 100.

Thus, the gas treatment apparatus 200 and gas treating process are successful in reducing the hazardous gas content of an effluent 100 by at least about 95% in a well controlled and consistent manner. The gas treatment system 200 may be a self-contained and integrated unit that is compatible with various process chambers 25. The gas treatment system 200 can be used to reduce a large variety of hazardous gases, including substantially all types of PFCs. The gas treatment system 200 has no impact on process chamber 25 operation and may be used with any process chamber that exhausts hazardous gases. The catalytic abatement system is convenient to handle and occupies less than 3 cubic feet for treating effluent from a single process chamber and less than 40 cubic feet for treating effluent from multiple process chambers.

Although the present invention has been described in considerable detail with regard to certain preferred versions thereof, other versions are possible. For example, the additive gas supplies 230 and the gas energizing systems 220 shown in FIGS. 2–5 may be interchangeable with each other. Also, the apparatus of the present invention can be used in other chambers and for other processes, such as physical vapor deposition and chemical vapor deposition. Therefore, the appended claims should not be limited to the description of the preferred versions contained herein.

What is claimed is:

1. A method of treating an effluent gas from a chamber, the method comprising:
   (a) introducing a first additive gas into a reactor, the first additive gas comprising (i) an inert gas at a first volumetric flow rate that is sufficiently high to strike a plasma when energized with microwave or RF energy, the inert gas comprising Ar, Ne, He or Xe, and (ii) a reactive gas comprising a first volumetric flow rate of at least one oxygen containing gas having oxygen atoms;
   (b) changing the first volumetric flow rate of the inert gas to a second volumetric flow rate that is different from the first volumetric flow rate and is sufficiently low to sustain a stabilized plasma and introducing the reactive gas into the plasma such that the volumetric flow ratio of inert gas to reactive gas is from about 1:1 to about 2.9:1, the reactive gas comprising an oxygen containing gas having a second volumetric flow rate that is selected so that the first volumetric flow rate of the oxygen containing gas is from about 20% to about 50% of the second volumetric flow rate of the oxygen containing gas; and
   (c) introducing the effluent gas into the reactor; and
   (d) energizing the gases in the reactor.

2. A method according to claim 1 wherein in step (b) the volumetric flow ratio of the inert gas to the reactive gas is from about 1.5 to about 2.

3. A method according to claim 1, wherein the effluent gas comprises perfluorocompound and wherein the volumetric flow rate of reactive gas is selected to reduce the content of a perfluorocompound of the effluent gas.

4. A method according to claim 1 wherein (d) comprises coupling microwave energy to the gases in the reactor.

5. A method according to claim 1 wherein (d) comprises inductively or capacitively coupling RF energy to the gases in the reactor to strike and sustain a stabilized plasma in the reactor.

6. A method of treating a chamber effluent gas comprising a hazardous gas, the method comprising the steps of:
   (a) introducing the effluent gas into a reactor, the effluent gas comprising sulfur-containing gas having sulfur atoms;
   (b) introducing into the reactor, a first additive gas comprising (i) an inert gas comprising Ar, Ne, He or Xe, and (ii) a reactive gas comprising a first volumetric flow rate of at least one oxygen containing gas having oxygen atoms;
   (c) introducing into the reactor, a second additive gas comprising the inert gas and the reactive gas in a volumetric flow ratio of from about 1:1 to about 2.9:1, the oxygen containing gas having a second volumetric flow rate that is selected so that (i) the ratio of oxygen atoms in the second additive gas to sulfur atoms in the effluent gas is at least about 2.4:1, and (ii) the first volumetric flow rate is from about 20% to about 50% of the second volumetric flow rate; and (d) energizing the effluent and additive gas in the reactor to strike and sustain a stabilized plasma capable of reducing the content of the hazardous gas in the effluent gas.

7. A method according to claim 6 wherein the volumetric flow rate of oxygen containing gas is selected to reduce a content of a perfluorocompound of the effluent gas.

8. A method according to claim 6 wherein the effluent gas comprises perfluorocompound and wherein the volumetric flow rate of oxygen containing gas is selected so that the ratio of oxygen atoms in the second additive gas to sulfur atoms in the perfluorocompound is at least about 2.4:1.

9. A method according to claim 6 wherein the additive gas comprises $O_2$.

10. A method according to claim 6 wherein (d) comprises coupling microwave energy to the effluent and additive gas in the reactor.

11. A method according to claim 6 wherein (d) comprises inductively or capacitively coupling RF energy to the effluent and additive gas in the reactor to strike and sustain a stabilized plasma in the reactor.

12. A method of treating a chamber effluent gas comprising a hazardous gas, the method comprising the steps of:
   (a) introducing the effluent gas into a reactor, the effluent gas comprising nitrogen containing gas having nitrogen atoms;
   (b) introducing into the reactor, a first additive gas comprising (i) an inert gas comprising Ar, Ne, He or Xe, and (ii) a reactive gas comprising a first volumetric flow rate of at least one oxygen containing gas having oxygen atoms;
   (c) introducing into the reactor, a second additive gas comprising the inert gas and the reactive gas in a volumetric flow ratio of from about 1:1 to about 2.9:1, the oxygen containing gas having a second volumetric flow rate that is selected so that (i) the ratio of oxygen atoms in the second additive gas to nitrogen atoms in the effluent gas is at least about 2.4:1, and (ii) the first volumetric flow rate is from about 20% to about 50% of the second volumetric flow rate; and
   (d) energizing the effluent and additive gas in the reactor to strike and sustain a stabilized plasma capable of reducing the content of the hazardous gas in the effluent gas.

13. A method according to claim 12 wherein the volumetric flow rate of oxygen containing gas is selected to reduce a content of a perfluorocompound of the effluent gas.

14. A method according to claim 12 wherein the effluent gas comprises perfluorocompound and wherein the volumetric flow rate of oxygen containing gas is selected so that the ratio of oxygen atoms in the second additive gas to nitrogen atoms in the perfluorocompound is at least about 2.4:1.

15. A method according to claim 12 wherein the additive gas comprises $O_2$.

16. A method according to claim 12 wherein (d) comprises coupling microwave energy to the effluent and additive gas in the reactor.

17. A method according to claim 12 wherein (d) comprises inductively or capacitively coupling RF energy to the effluent and additive gas in the reactor to strike and sustain a stabilized plasma in the reactor.

18. A method of treating a chamber effluent gas comprising a hazardous gas having carbon atoms, the method comprising:
   (a) introducing the effluent gas into a reactor;
   (b) introducing into the reactor, a first additive gas comprising (i) an inert gas comprising Ar, Ne, He or Xe, and (ii) a reactive gas comprising a first volumetric flow rate of oxygen containing gas having oxygen atoms;
   (c) introducing into the reactor, a second additive gas comprising the inert gas and the reactive gas in a volumetric flow ratio of from about 1:1 to about 2.9:1, the oxygen containing gas having a second volumetric flow rate that is selected so that (i) the ratio of oxygen atoms in the second additive gas to carbon atoms in the effluent gas is at least about 2.4:1, and (ii) the first volumetric flow rate is from about 20% to about 50% of the second volumetric flow rate; and
   (d) coupling RF energy to the effluent and additive gas in the reactor to strike and sustain a stabilized plasma in the reactor to reduce the content of the hazardous gas in the effluent gas.

19. A method according to claim 18 wherein the volumetric flow rate of oxygen containing gas is selected to reduce a content of a perfluorocompound of the effluent gas.

20. A method according to claim 18 wherein the effluent gas comprises perfluorocompound and wherein the volumetric flow rate of oxygen containing gas is selected so that the ratio of oxygen atoms in the second additive gas to carbon atoms in the perfluorocompound is at least about 2.4:1.

21. A method according to claim 18 comprising introducing the inert gas so that the volumetric flow ratio of inert gas to oxygen containing gas is from about 1.5 to about 2.

22. A method according to claim 18 wherein (c) comprises inductively or capacitively coupling the RF energy to the effluent and additive gas.

23. A method of treating a chamber effluent gas comprising a hazardous gas comprising carbon atoms, the method comprising:
   (a) introducing the effluent gas into a reactor;
   (b) introducing into the reactor, a first additive gas comprising (i) an inert gas comprising Ar, Ne, He or Xe, and (ii) a reactive gas comprising a first volumetric flow rate of at least one oxygen containing gas having oxygen atoms;
   (c) introducing into the reactor, a second additive gas comprising the inert gas and the reactive gas in a volumetric flow ratio of from about 1:1 to about 2.9:1, the oxygen containing gas having a second volumetric flow rate that is selected so that (i) the ratio of oxygen atoms in the additive gas to carbon atoms in the hazardous gas is at least about 2.4:1, and (ii) the first volumetric flow rate is from about 20% to about 50% of the second volumetric flow rate; and
   (d) coupling microwave or RF energy to the effluent and additive gas in the reactor to energize the effluent gas and the additive gas to strike and sustain a plasma capable of reducing the content of hazardous gas in the effluent gas.

24. A method according to claim 23 wherein the second volumetric flow rate of oxygen containing gas is further selected to reduce a content of a perfluorocompound of the effluent gas.

25. A method according to claim 23 wherein the oxygen-containing gas comprises $O_2$.

26. A method according to claim 23 wherein in step (c), the volumetric flow ratio of inert gas to oxygen containing gas is from about 1.5 to about 2.

* * * * *